(12) United States Patent
Johnson

(10) Patent No.: US 8,476,630 B2
(45) Date of Patent: Jul. 2, 2013

(54) METHODS OF ADDING PADS AND ONE OR MORE INTERCONNECT LAYERS TO THE PASSIVATED TOPSIDE OF A WAFER INCLUDING CONNECTIONS TO AT LEAST A PORTION OF THE INTEGRATED CIRCUIT PADS THEREON

(75) Inventor: Morgan T. Johnson, Hillsboro, OR (US)

(73) Assignee: Advanced Inquiry Systems, Inc., Beaverton, OR (US)

( * ) Notice: Subject to any disclaimer, the term of this patent is extended or adjusted under 35 U.S.C. 154(b) by 0 days.

(21) Appl. No.: 13/314,327

(22) Filed: Dec. 8, 2011

(65) Prior Publication Data

US 2012/0156811 A1 Jun. 21, 2012

Related U.S. Application Data

(63) Continuation of application No. 12/617,705, filed on Nov. 12, 2009, now Pat. No. 8,088,634.

(60) Provisional application No. 61/113,544, filed on Nov. 11, 2008.

(51) Int. Cl.
*H01L 29/04* (2006.01)

(52) U.S. Cl.
USPC .............. 257/49; 438/11; 438/17; 438/18

(58) Field of Classification Search
USPC ............................................. 438/17; 257/49
See application file for complete search history.

(56) References Cited

U.S. PATENT DOCUMENTS

| | | | |
|---|---|---|---|
| 7,521,812 B2* | 4/2009 | Lee et al. | 257/784 |
| 2003/0203521 A1* | 10/2003 | Kohno et al. | 438/15 |
| 2006/0163744 A1* | 7/2006 | Vanheusden et al. | 257/773 |
| 2007/0007661 A1* | 1/2007 | Burgess et al. | 257/778 |
| 2007/0046313 A1* | 3/2007 | Eldridge et al. | 324/765 |
| 2008/0073789 A1* | 3/2008 | Harris | 257/758 |

* cited by examiner

*Primary Examiner* — Ajay K Arora
(74) *Attorney, Agent, or Firm* — Perkins Coie LLP

(57) ABSTRACT

A pattern of conductive ink is disposed on the topside of the unsingulated integrated circuits of a wafer, and, typically after wafer probing, the pattern of conductive ink is removed. The conductive ink pattern provides an electrical pathway between bond pads on an integrated circuit and large contact pads disposed on the topside of the integrated circuit. Each of the large contact pads is much greater in area than the corresponding bond pads, and are spaced apart so that the pitch of the large contact pads is much greater than that of the bond pads. In one aspect of the present invention, the conductive ink includes a mixture of conductive particles and wafer bonding thermoset plastic. In another aspect of the present invention, the conductive ink is heated and disposed on a wafer by an ink jet printing system.

12 Claims, 11 Drawing Sheets

METHODS OF ADDING PADS AND ONE OR MORE INTERCONNECT LAYERS TO THE PASSIVATED TOPSIDE OF A WAFER INCLUDING CONNECTIONS TO AT LEAST A PORTION OF THE INTEGRATED CIRCUIT PADS THEREON

RELATED APPLICATIONS

This application is a Continuation of U.S. patent application Ser. No. 12/617,705 filed Nov. 12, 2009, and entitled "Methods of Adding Pads and One or More Interconnect Layers to the Passivated Topside of a Wafer Including Connections to at Least a Portion of the Integrated Circuit Pads Thereon", which application claims the benefit of Provisional Application No. 61/113,544, filed Nov. 11, 2008, and entitled "A Method of Adding One or More Layers of Conductive Traces and Pads To The Surface of a Fully Manufactured Wafer Including Connection To All Or A Selected Sub Set of the Pads On The Die Within the Wafer", the entirety of which is hereby incorporated by reference.

FIELD OF THE INVENTION

The present invention relates generally to semiconductor manufacturing, and more particularly relates to methods for providing electrical pathways between the pads of integrated circuits on a wafer and circuitry external to the wafer.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. These conductive regions are commonly referred to as pads, or bond pads. During testing, which is often referred to as wafer probing or wafer sorting, the pads are commonly contacted with a probe card. Such wafer probing typically includes mounting the wafer on a moveable chuck that is used to position the wafer relative to a probe card and to hold the wafer in place during testing.

As the physical dimensions of integrated circuits continue to shrink, the pad size and pad pitch have also been shrinking. Consequently, it has become more difficult and costly to manufacture and maintain probe cards that are capable of contacting integrated circuits with small pads with tight pad pitch.

What is needed are methods and structures for reducing the need for high precision and high maintenance probe cards.

SUMMARY OF THE INVENTION

Briefly, a pattern of conductive ink is disposed on the topside of the unsingulated integrated circuits of a wafer, and, typically after wafer probing, the pattern of conductive ink is removed. The conductive ink pattern provides an electrical pathway between bond pads on an integrated circuit and large contact pads disposed on the topside of the integrated circuit. Each of the large contact pads is much greater in area than the corresponding bond pads, and are spaced apart so that the pitch of the large contact pads is much greater than that of the bond pads.

In one aspect of the present invention, the conductive ink includes a mixture of conductive particles and wafer bonding thermoset plastic.

In another aspect of the present invention, the conductive ink is heated and disposed on a wafer by an ink jet printing system.

DETAILED DESCRIPTION

Figure 1:
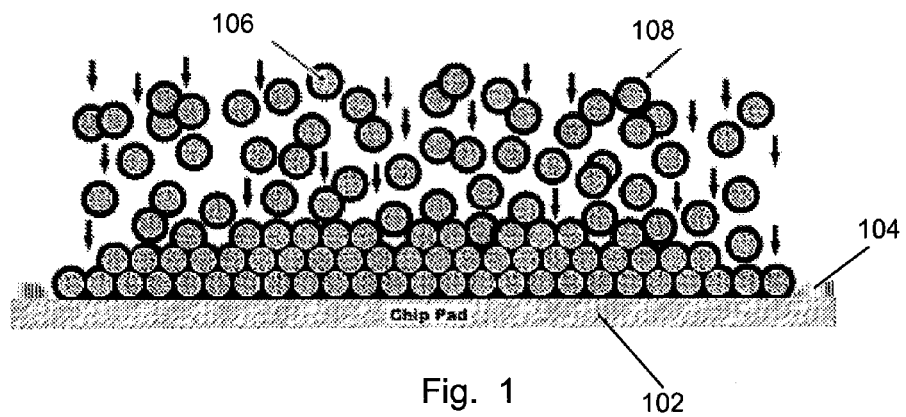
FIG. 1 is a cross-sectional representation of a portion of a wafer during deposition of a conductive ink over a bond pad of an integrated circuit.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

TERMINOLOGY

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

The present invention relates to a method of adding one or more layers of conductive traces and pads to the surface of a fully manufactured wafer including connection to all or a selected subset of the pads on the die within the wafer. Starting with a finished semiconductor wafer (of any product) that has a topside passivation layer with openings that expose at least a portion of the contact pads, the wafer is aligned to a system that applies the desired pattern of connections between the contact pads and a corresponding set of large pads disposed over the topside passivation layer. These can be stencil printing in a manner similar to solder pasted, ink jet printed from equipment meant to print conductive inks or liquids or by other means that exist for applying and patterning materials on wafers. In an illustrative embodiment, a mixture of wafer bonding plastic and conductive nano-particles is applied in stages with an ink jet printer to yield a pattern of "wires" between the bond pads and the large contact pads over the balance of the die for later contact with probes, pogo pins or even inexpensive large pitch probe cards. The mixture may be conductive nano-particles and thermo set plastic (such as Brewer Scientific wafer bonding material).

The mixture is applied hot, and upon cooling, the bonding plastic shrinks to pull the metallic particles into contact with each other and with the exposed contact pads. Adhesion of the bonding plastic to the wafer surface causes most shrinkage to be in the Z-axis, rather than in the X- or Y- (i.e., horizontal) axes, thereby preserving the two-dimensional (2D) shape of the features.

The surface of the big pads may require some penetration to reach the conductive elements but most probes will automatically provide this function.

After probing with the lower cost equipment and processes enabled by the large pads, the material is heated and dissolved away, thereby restoring the wafer surface to a pre-tested condition.

These steps produce a robust, large pitch and large area pad set to enable wafer testing with greater parallelism and lower cost equipment and processes.

When carried out properly the wafer can be probed many times to perform many tests, and when completed, the contact pads have virtually no marks or damage. This will increase assembly yield and allow more testing without risk of damage to the contact pads. This is critical in multi-chip packages where yield of the wire bonds is critical and Known Good Die are required. For example, the composite material can be a premixed conductive elastomer that is applied, cured and is at all stages conductive.

Another example is a mixture of conductive particles in a dielectric matrix that is made conductive in a desired pattern by exposing the material with a laser to cause shrinkage as described earlier; sintering of the metallic particles to create connections; or triggering chemical changes with a laser to cause cross-linking to make a conductive polymer.

The materials previously listed can be exchanged to modify the durability of the conductive phase or can in fact be made permanent on the surface of the wafer. Other manifestations can be used to bond wafers together with conductive pathways between or among wafers either permanently of temporarily.

Various embodiments of the present invention provide a method of disposing and removing at least one patterned layer of conductive material on the circuit side of a wafer, the patterned layer providing conductive pathways between contact pads and a corresponding set of large pads, thereby enabling conventional low-cost probes and probe systems to contact the large pads while being electrically coupled to the contact pads, which are significantly smaller in area than the large pads. After electrical tests are performed, the at least one patterned conductive layer is removed, leaving tested dice on the wafer, each die having contact pads that are undamaged by testing.

An illustrative method of adding one or more layers of conductive traces and pads to the surface of a fully manufactured wafer including connection to all or a selected subset of the contact pads on the die within the wafer is described below. Conductive metal nano-particles are mixed in correct proportion (e.g., 40% to 50%) with an existing thermoset plastic commonly used to bond wafers together for a wafer thinning operation. This mixture is applied hot to the wafer in a pattern that connects the existing contact pads on the wafer to much larger, easier to contact conductive pads disposed over the surface of the topside passivation layer of the wafer, wherein those large pads are also formed from the deposited mixture. This mixture has a high Coefficient of Thermal Expansion (CTE), and upon cooling, the metal particles are pulled against each other and against the metal surface of the contact pads to create a conductive surface, i.e., the large pads, which are electrically coupling to the contact pads. These large pads are typically 300 to 500 times the area of the contact pads. When wafer probing is finished, the wafer is heated and the mixture is removed with a flowing solvent. No residue, or substantially no residue, remains on the wafer since the material was not brought to its set temperature. Metallic components are reusable, as is the bonding material. This lowers the cost of contacting full wafers for test.

FIGS. 1-16 show various stages of an illustrative method for adding large contact pads to the topside passivation layer of an unsingulated wafer, the large contact pads coupled to the integrated circuit bond pads, testing the unsingulated integrated circuits on the wafer by way of electrical communication through the large contact pads, and removing the large contact pads and associated connections to the bonding pads.

FIG. 1 is a cross-sectional representation of a portion of a wafer during deposition of a conductive ink over a bond pad of an integrated circuit. A bonding pad 102, sometimes referred to as a chip pad, is covered around its peripheral edges by a topside passivation layer 104. Bonding pad 102 is typically formed from a metal, a metal alloy, or a stack of metals and/or metal alloys. Various materials, such as, oxides, nitrides, and polyimides, may be used as topside passivation layers. The present invention is not limited to any particular composition of the topside passivation layer. FIG. 1 further shows metallic nano-spheres 106 having a bonding plastic coating 108 being deposited over bonding pad 102. In an illustrative embodiment, wafer bonding thermoset plastic is heated and mixed with conductive nano-spheres and then disposed on the topside of the bonding pad. Such a mixture may be referred to as a conductive ink, since it can be applied in a manner similar to printing, and the resulting pattern is electrically conductive. Disposing the heated mixture on the wafer may be accomplished by ink jet, stenciling, or by coating the surface and then etching the desired pattern. The desired pattern is one which electrically connects to bonding pads 102 with corresponding larger contact pads disposed on the topside of the integrated circuit. The larger contact pads facilitate wafer probing by providing large targets for probe cards and therefore less precision is needed in constructing and maintaining the probe cards.

Figure 2:
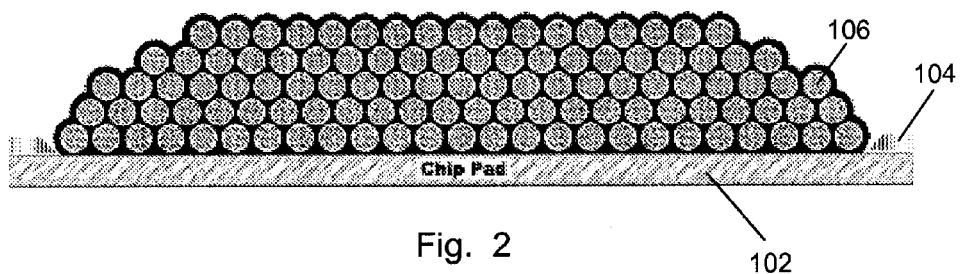
FIG. 2 shows the structure of FIG. 1 subsequent to the deposition step, and wherein the conductive spheres of the conductive ink have settled into the predetermined pattern.

FIG. 2 shows the structure of FIG. 1 subsequent to the deposition step, and wherein the conductive spheres of the conductive ink have settled into the predetermined pattern and are cooling.

Figure 3:
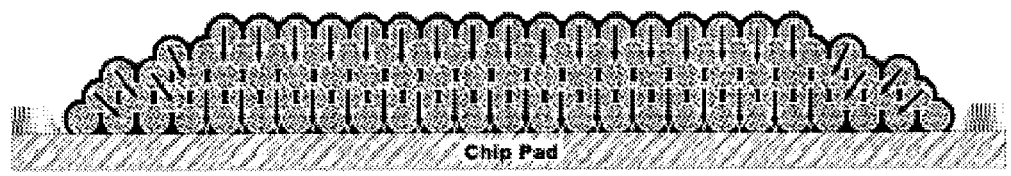
FIG. 3 shows the structure of FIG. 2 subsequent to cooling which causes the conductive spheres to pack more closely together.

FIG. 3 shows the structure of FIG. 2 subsequent to cooling which causes the conductive spheres to pack more closely together. In this illustrative embodiment, the conductive ink is characterized by a high coefficient of thermal expansion (CTE). Cooling shrinks the high CTE material, thereby forcing the metal nano-spheres into contact with each other and with the metal bond pads.

Figure 4:
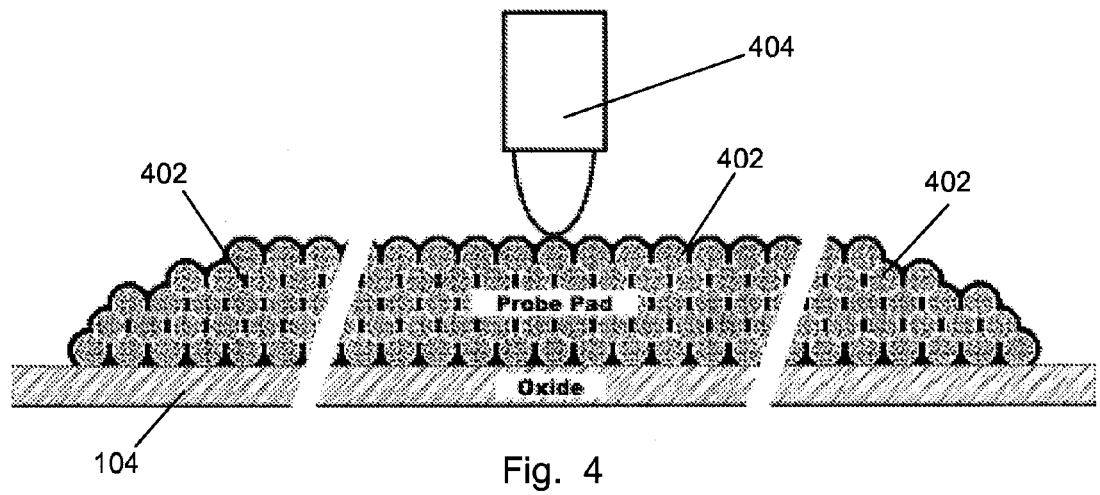
FIG. 4 is a cross-sectional representation of a portion of a wafer where conductive ink has been deposited over a passivated portion of the surface of the wafer, that is an area spaced apart from a bond pad of an integrated circuit.

FIG. 4 is a cross-sectional representation of a portion of a wafer where conductive ink has been deposited over a passivated portion of the surface of the wafer, that is, an area spaced apart from a bond pad of an integrated circuit. A large contact pad 402 formed from the deposition and cooling of conductive ink, is disposed on topside passivation layer 104. In this illustrative embodiment, large pad 402 is 300 to 500 times greater in area than the bonding pads of the integrated circuits. A probe structure 404 is shown in contact with large pad 402. After wafer probing, large pad 402, and all of the associated conductive ink previously deposited, are washed off, leaving the integrated circuit tested and the bonding pads undamaged by contact with any probe structures.

Figure 5:
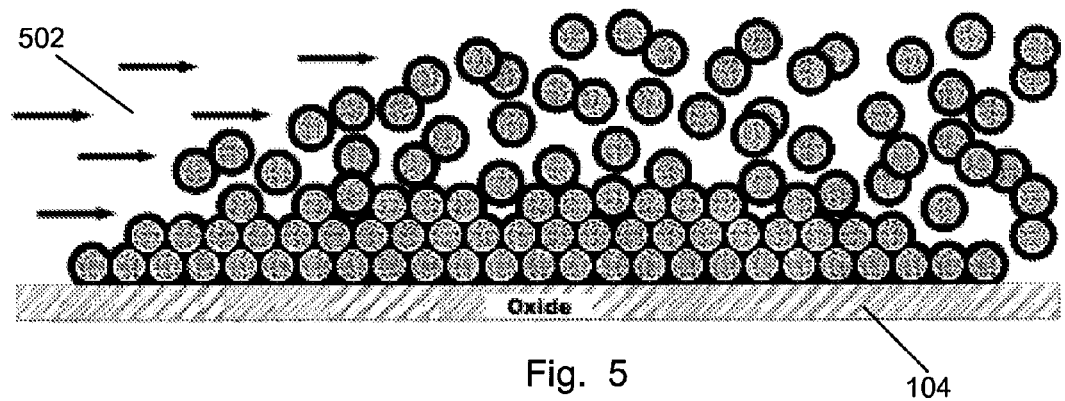
FIG. 5 shows the structure of FIG. 4 after heating and during flow of a solvent across the wafer to remove the previously deposited conductive ink.

FIG. 5 shows the structure of FIG. 4 after heating and during flow 502 of a solvent across the wafer to remove the previously deposited conductive ink.

Figure 6:
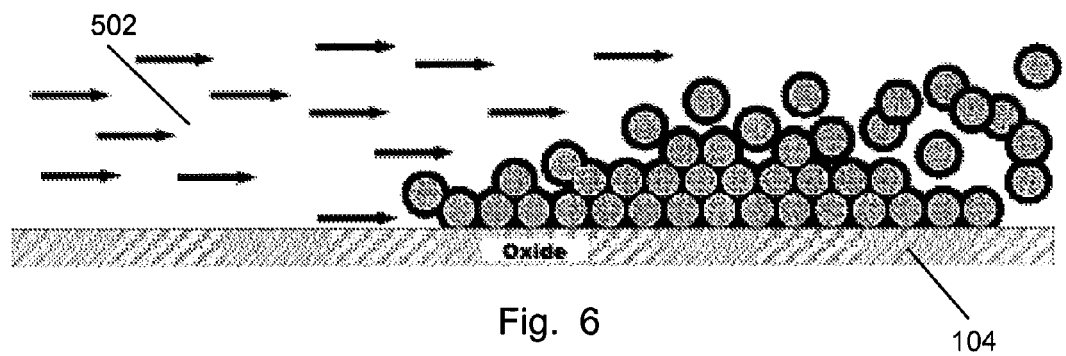
FIG. 6 is similar to FIG. 5, and shows the continuation of the conductive ink removal process.

FIG. 6 is similar to FIG. 5, and shows the continuation of the conductive ink removal process.

Figure 7:
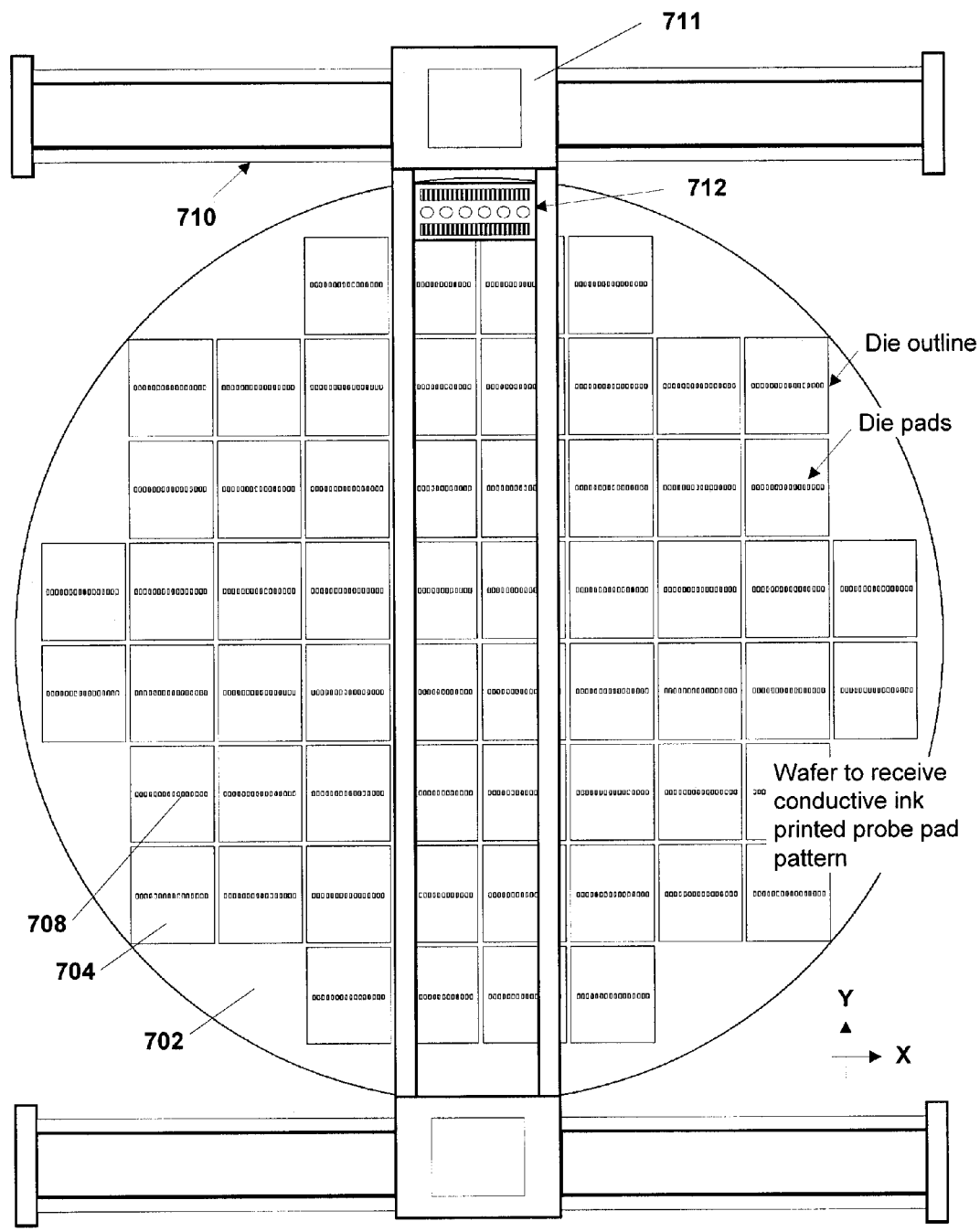
FIG. 7 is a top view of a wafer that has been aligned to an ink jet printer system which can deliver conductive ink compounds.

FIG. 7 is a top view of a wafer that has been aligned to an ink jet printer system which can deliver conductive ink mixtures. It can be seen that a wafer 702 has a plurality of integrated circuits 704 thereon, and that each integrated circuit 704 has a plurality of bond pads 708. In this illustrative embodiment, bond pads 708 are disposed in a single row across a center portion of each integrated circuit 704. Those skilled in the field of integrated circuits will recognize that many different layouts, or arrangements, of the bond pads on an integrated circuit are possible. The present invention is not limited to any particular layout or arrangement of bond pads. Still referring to FIG. 7, it can be seen that wafer 702 is aligned to the motion system of an ink jet printer 710. Ink jet printer 710 is operable to deliver conductive ink compounds to the topside of the wafer, including inks requiring heating in order to be jetted to a surface. Ink jet printer 710 includes an ink jet print head and ink supply subassembly 712. Ink jet print head and ink supply subassembly 712 is movably mounted to a traveling member 711. Traveling member 711 moves back and forth in the x-direction, and ink jet print head and ink supply subassembly 712 moves back and forth in the y-direction. In this way, the conductive ink can be delivered to any point on the wafer.

Figure 8:
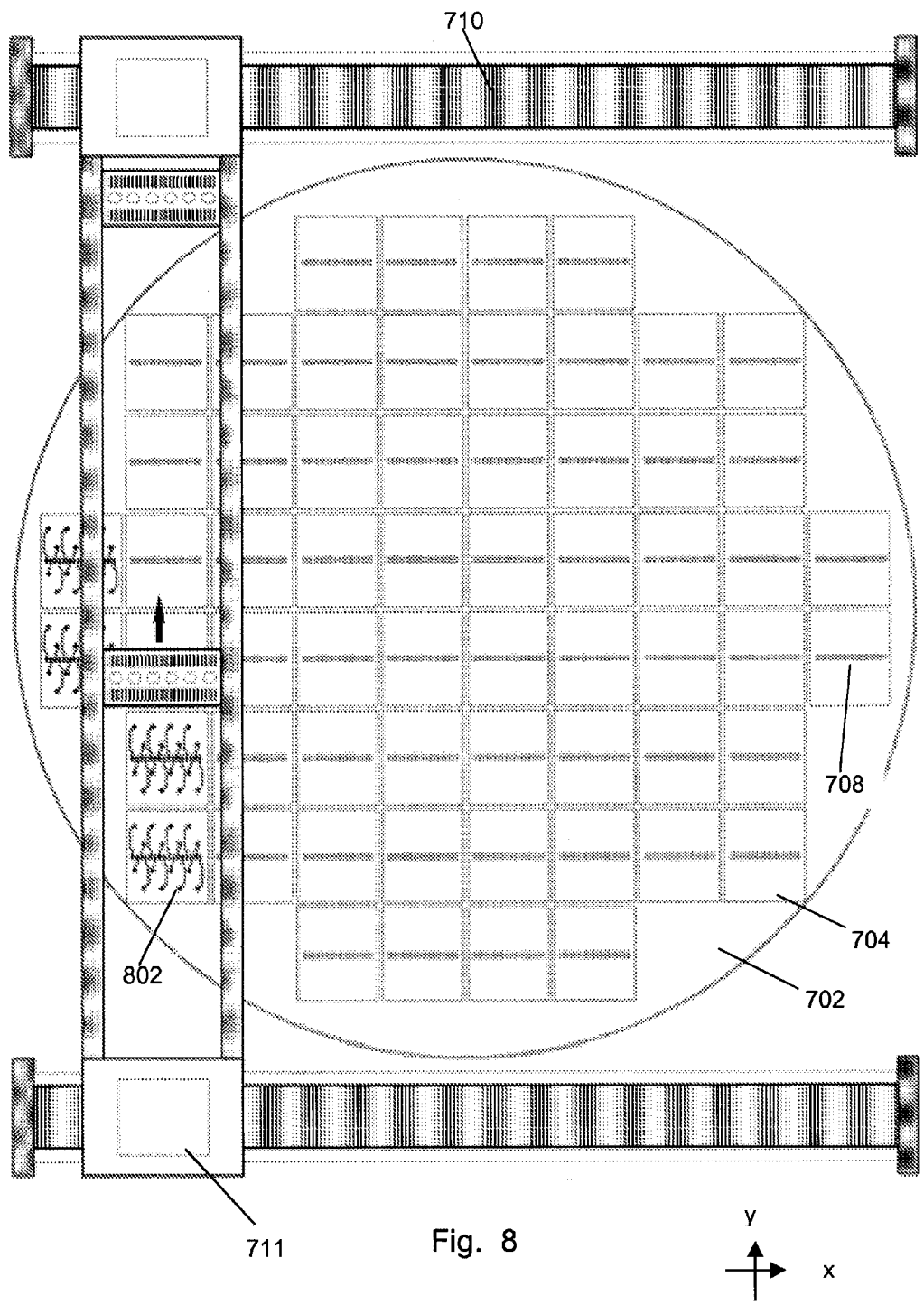
FIG. 8 is a top view of a wafer wherein the ink jet printer system has begun printing conductive lines connected to the bond pads of the integrated circuits.

FIG. 8 is a top view of wafer 702 and ink jet printer system 710, wherein ink jet printer system 710 has begun printing conductive lines 802 on integrated circuits 704, and conductive lines 802 are in contact with bond pads 708 of integrated circuits 704. In this illustrative embodiment, a first pass of the ink jet system prints conductive lines 802, while a second pass (FIGS. 11-13) prints the large contact pads.

Figure 9:
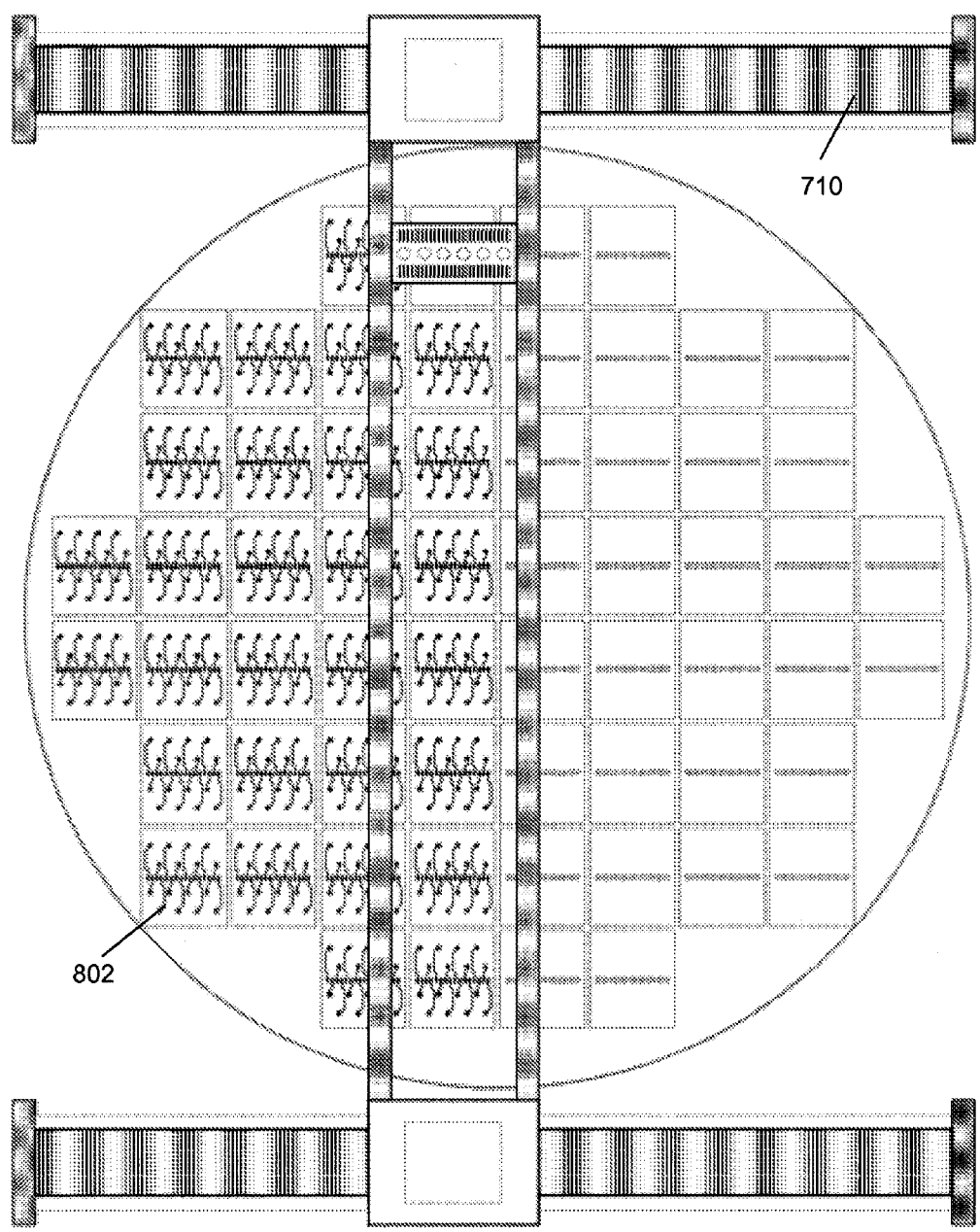
FIG. 9 is a top view of the wafer of FIG. 8, wherein the ink jet printer system continues to print conductive lines connected to the bond pads of the integrated circuits.

FIG. 9 shows the wafer of FIG. 8, wherein the ink jet printer system continues to print conductive lines 802 connected to the bond pads of the integrated circuits.

Figure 10:
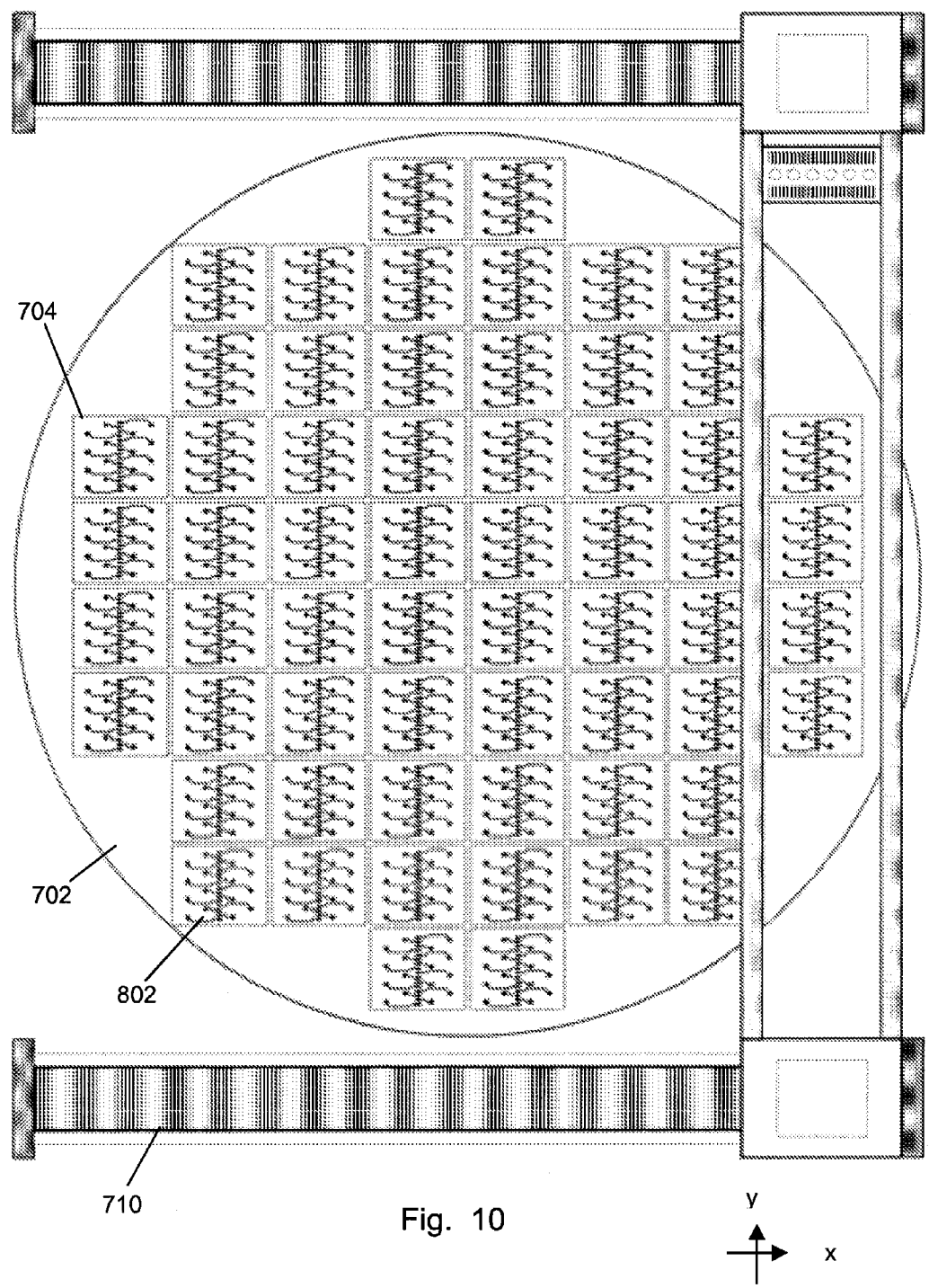
FIG. 10 is a top view of the wafer of FIG. 9 wherein the ink jet printer system has completed printing conductive lines connected to the bond pads of the integrated circuits.

FIG. 10 shows the wafer of FIG. 9 wherein the ink jet printer system has completed printing conductive lines 802 on the integrated circuits.

Figure 11:
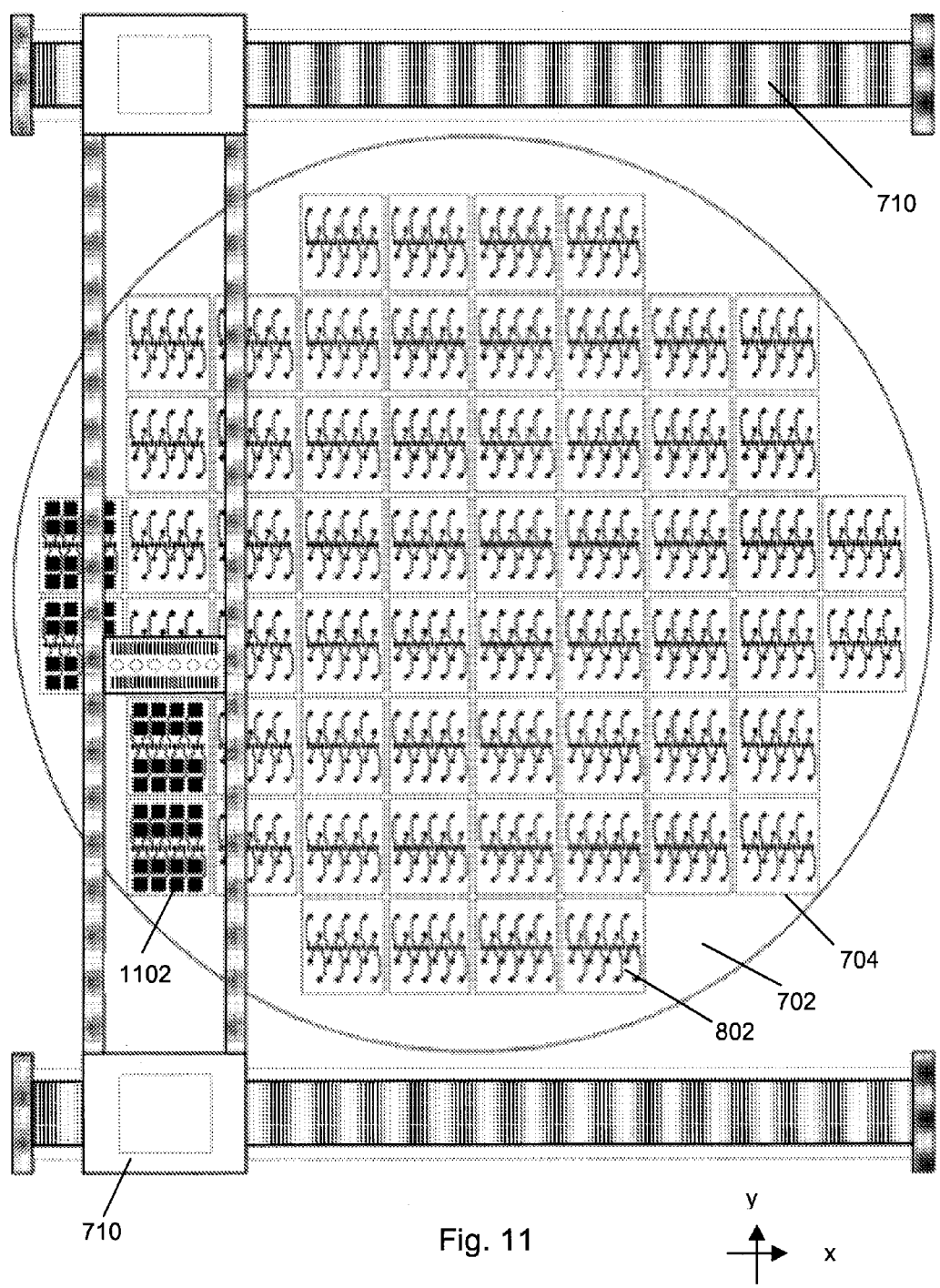
FIG. 11 is a top view of the wafer of FIG. 10 as the ink jet printer system begins a second pass of printing conductive ink, this time to form contact pads that are significantly larger than the bonding pads of the integrated circuits.

FIG. 11 is a top view of wafer 702 as ink jet printer system 710 begins a second pass of printing conductive ink, this time to form a plurality of large contact pads 1102. Large contact pads 1102 are placed so that they are in electrical connection with corresponding conductive lines 802. It is noted that large contact pads 1102 are significantly larger than bond pads 708 of integrated circuits 704. In typical embodiments, large contact pads 1102 are 300 to 500 times greater in area than bond pads 708. Similarly, in typical embodiments, the pitch of large contact pads 1102 is greater than the pitch of bond pads 708. Advantageously, the large pads and large pitch obtained with the present invention make designing and building a probe structure relatively easy. The present invention is not limited to any particular size or pitch for the large contact pads.

Figure 12:
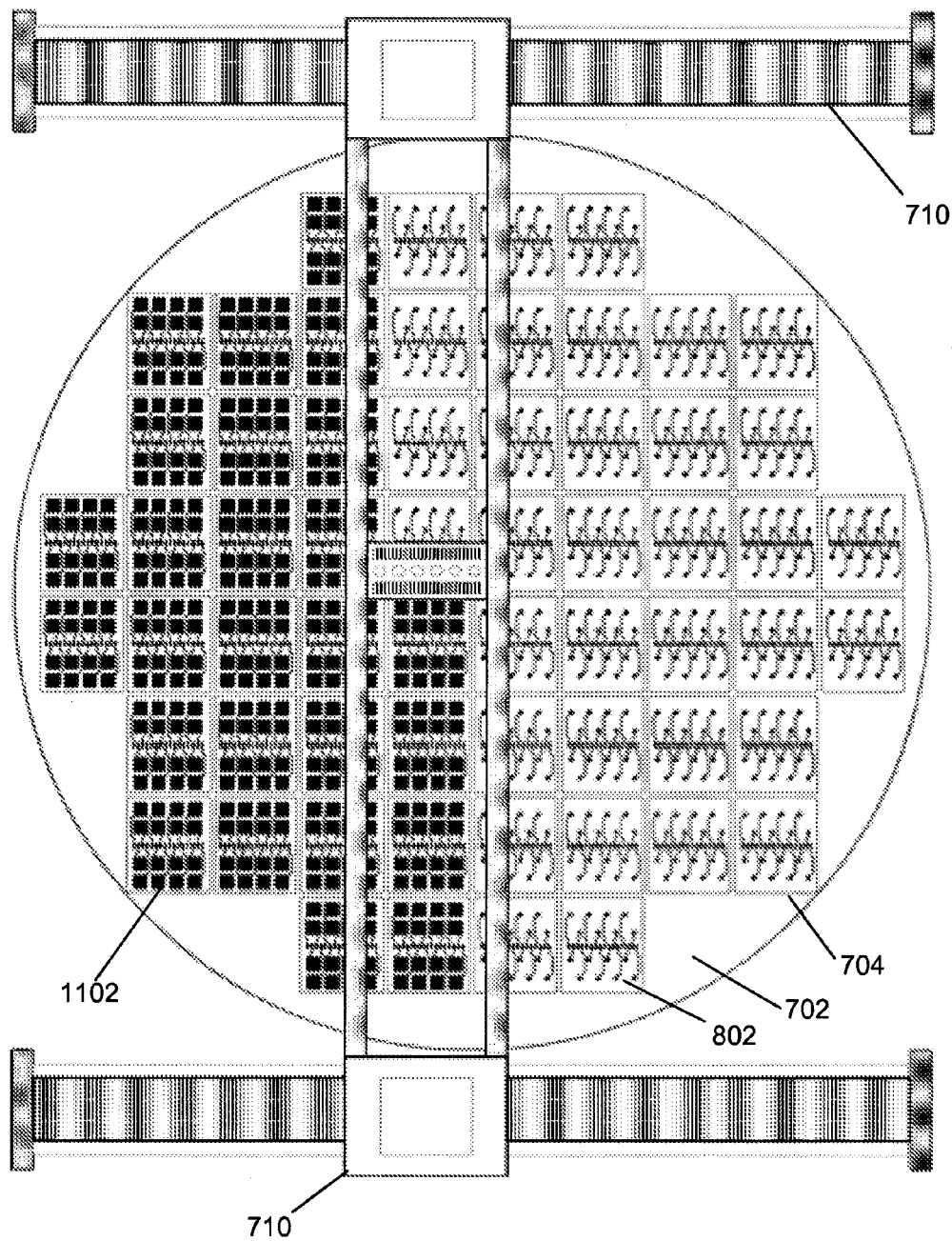
FIG. 12 is a top view of the wafer of FIG. 11 wherein the ink jet printer system continues to print large contact pads.
Figure 12:
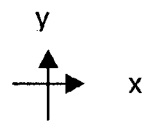

FIG. 12 shows wafer 702 wherein the ink jet printer system 710 continues to print large contact pads 1102.

Figure 13:
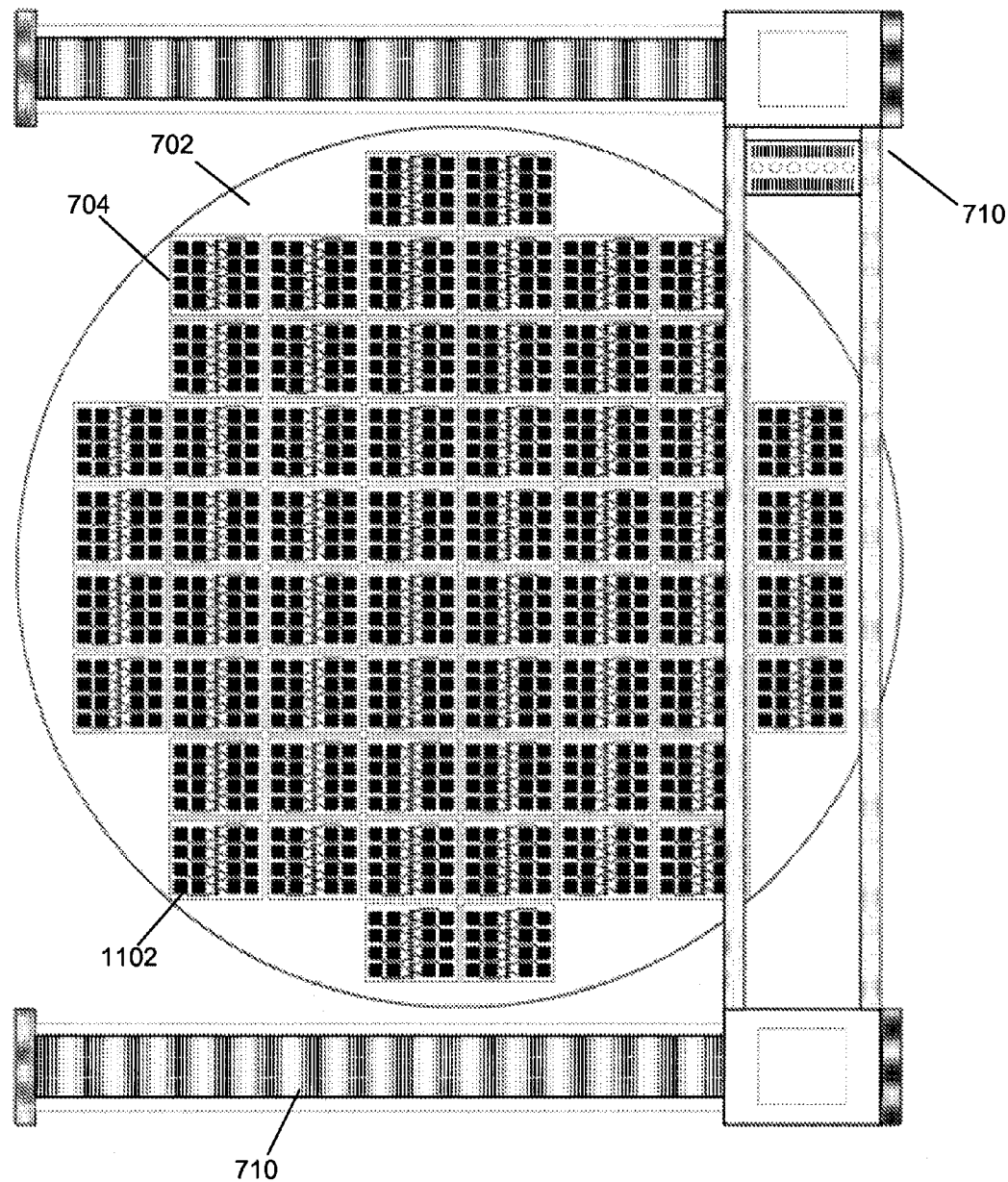
FIG. 13 is a top view of the wafer of FIG. 12 wherein the ink jet printer system has completed printing large contact pads across the wafer.

FIG. 13 shows wafer 702 wherein the ink jet printer system 710 has completed printing large contact pads 1102 across the wafer 702.

Figure 14:
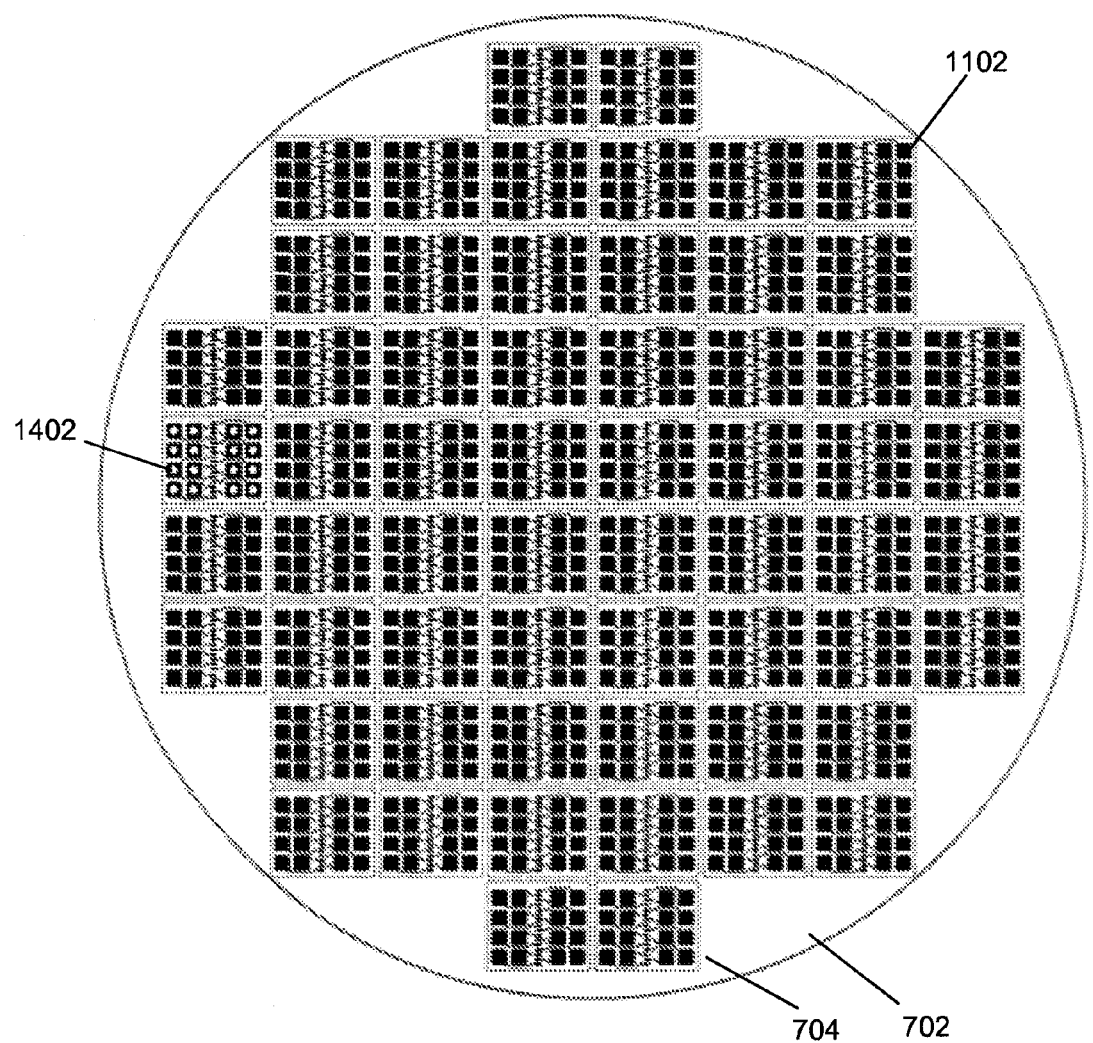
FIG. 14 is a top view of a wafer having interconnections and large pads printed thereon, and an indication of where the large contact pads on one integrated circuit are contacted during wafer probing.

FIG. 14 is a top view of wafer 702 having interconnections and large pads printed thereon, and an indication 1402 of where the large contact pads 1102 on one integrated circuit are contacted during wafer probing.

Figure 15:
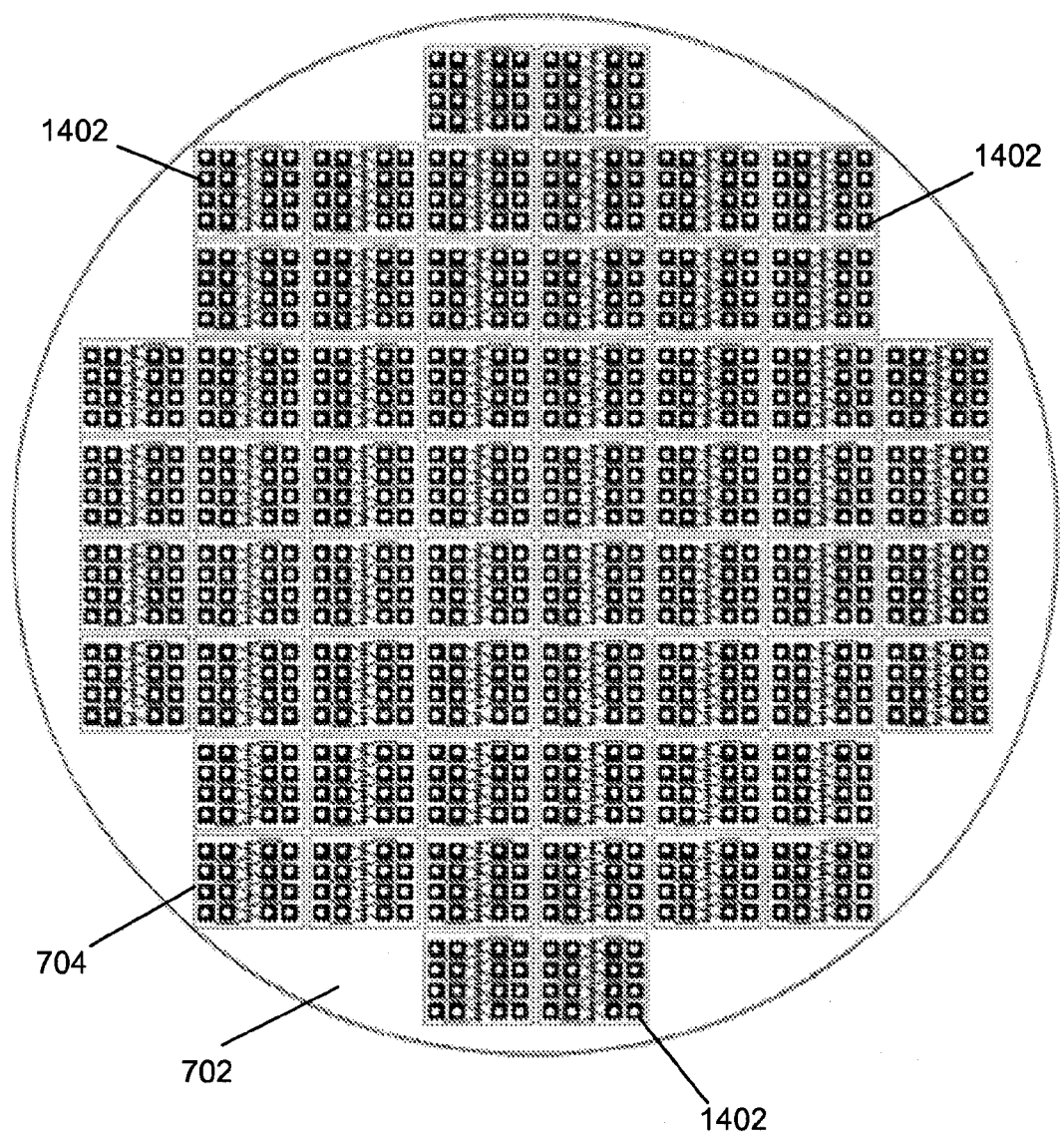
FIG. 15 is similar to FIG. 14, but shows where all the large contact pads are contacted during wafer probe.

FIG. 15 is similar to FIG. 14, but shows where all the large contact pads are contacted during wafer probe.

An illustrative method, in accordance with the present invention includes, providing a wafer, the wafer having a plurality of integrated circuits thereon and further having a patterned passivation layer disposed thereon, the patterned passivation layer having openings therethrough, each opening exposing at least a portion of an integrated circuit pad; depositing conductive ink, in a first predetermined pattern, over at least a portion of the exposed integrated circuit pads; and depositing conductive ink, in a second predetermined pattern, over at least a portion of the patterned passivation layer; wherein the first predetermined pattern includes conductive lines, the second predetermined pattern include large contact pads, and at least one conductive line is electrically connected to at least one large pad. Some embodiments further include electrically coupling at least one of the plurality of large contact pads to a probe structure. Some embodiments further include heating the conductive ink on the wafer and washing the wafer with a solvent.

An illustrative method of forming temporary contact terminals on the passivated surface of integrated circuits on a wafer, includes providing a wafer, the wafer having a plurality of integrated circuits thereon and further having a patterned passivation layer disposed thereon, the patterned passivation layer having openings therethrough, each opening exposing at least a portion of an integrated circuit pad; mixing wafer bonding thermoset plastic and conductive particles; heating the mixture of wafer bonding thermoset plastic and conductive particles; depositing the mixture onto the wafer in a predetermined pattern; and cooling the deposited mixture. Once the temporary contact terminals are formed, wafer probing may be performed. The temporary contact terminals can be removed by heating the deposited mixture and exposing the heated mixture to a solvent.

CONCLUSION

The exemplary apparatus illustrated and described herein find application in at least the field of integrated circuit test and analysis.

It is to be understood that the present invention is not limited to the embodiments described above, but encompasses any and all embodiments within the scope of the subjoined Claims and their equivalents.

What is claimed is:

1. An apparatus for wafer testing, comprising:
a wafer having a plurality of integrated circuits with a patterned passivation layer disposed on the integrated circuits, the patterned passivation layer having openings therethrough, an individual opening exposing at least a portion of a corresponding integrated circuit pad;
a first conductive pattern having conductive lines with individual conductive lines having a first end and a second end, an individual conductive line being connected to a corresponding integrated circuit pad toward the first end; and
a second conductive pattern comprising one or more individual contact pads disposed over the passivation layer, an individual contact pad being connected to the corresponding conductive line toward the second end, the individual contact pad having a surface area that is greater than a surface area of the corresponding integrated circuit pad,
wherein the conductive lines and the contact pads comprise printable ink.

2. The apparatus of claim 1, further comprising a probe structure in contact with the contact pads.

3. The apparatus of claim 1 wherein the individual contact pads are 300-500 times larger than the corresponding integrated circuit pads.

4. The apparatus of claim 1 wherein a pitch of the contact pads is larger than the pitch of the corresponding integrated circuit pads.

5. The apparatus of claim 1, wherein at least one contact pad is capable of providing an indication of being touched by a probe.

6. The apparatus of claim 1 wherein the conductive lines and the contact pads can be washed off by a solvent.

7. An apparatus for wafer testing, comprising:
a wafer having a plurality of integrated circuits with a patterned passivation layer disposed on the integrated circuits, the patterned passivation layer having openings therethrough, an individual opening exposing at least a portion of a corresponding integrated circuit pad;
a conductive line disposed in a generally horizontal plane over the wafer, the conductive line having a first end and a second end, the conductive line being connected to a corresponding integrated circuit pad toward the first end; and
a conductive contact pad disposed over the passivation layer and being connected to the conductive line toward the second end, the contact pad having a surface area that is greater than a surface area of the corresponding integrated circuit pad,
wherein at least one of the conductive line and the contact pad is printed and is removable by a solvent that does not substantially remove the integrated circuit pad.

8. The apparatus of claim 7, further comprising a probe in contact with the contact pad.

9. The apparatus of claim 7 wherein the contact pad is 300-500 times larger than the corresponding integrated circuit pad.

10. The apparatus of claim 7 wherein the at least one of the conductive line and the contact pad is heated and dissolved away.

11. The apparatus of claim 7 wherein the integrated circuit pad is undamaged after removing the contact pad.

12. An apparatus for wafer testing, comprising:
a wafer having a plurality of integrated circuits with a patterned passivation layer disposed on the integrated circuits, the patterned passivation layer having openings therethrough, an individual opening exposing at least a portion of a corresponding integrated circuit pad;
a first conductive pattern having conductive lines with individual conductive lines having a first end and a second end, an individual conductive line being connected to a corresponding integrated circuit pad toward the first end; and
a second conductive pattern comprising one or more individual contact pads disposed over the passivation layer, an individual contact pad being connected to the corresponding conductive line toward the second end, the individual contact pad having a surface area that is greater than a surface area of the corresponding integrated circuit pad,
wherein the conductive lines and the contact pads comprise conductive nano-particles and thermoset plastic.

* * * * *